(12) United States Patent
Doris et al.

(10) Patent No.: US 6,908,850 B2
(45) Date of Patent: Jun. 21, 2005

(54) STRUCTURE AND METHOD FOR SILICIDED METAL GATE TRANSISTORS

(75) Inventors: Bruce B. Doris, Brewster, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,130

(22) Filed: Sep. 10, 2003

(65) Prior Publication Data

US 2005/0055494 A1 Mar. 10, 2005

(51) Int. Cl.⁷ .......................................... H01I 21/4763
(52) U.S. Cl. .................................................... 438/630
(58) Field of Search ................................ 438/630, 648, 438/649, 650, 651, 655, 656, 682, 683, 685, 197, 259, 270, 299, 300, 301, 302, 303, 304

(56) References Cited

U.S. PATENT DOCUMENTS

| | | | | |
|---|---|---|---|---|
| 5,863,823 A | * | 1/1999 | Burgener | 438/295 |
| 6,033,963 A | * | 3/2000 | Huang et al. | 438/303 |
| 6,074,915 A | * | 6/2000 | Chen et al. | 438/258 |
| 6,090,648 A | * | 7/2000 | Reedy et al. | 438/155 |
| 6,300,206 B1 | * | 10/2001 | Fukada et al. | 438/303 |
| 6,417,046 B1 | * | 7/2002 | Ho et al. | 438/257 |
| 6,492,694 B2 | | 12/2002 | Nobel et al. | |
| 6,528,362 B1 | | 3/2003 | Besser et al. | |
| 6,534,352 B1 | * | 3/2003 | Kim | 438/197 |
| 6,544,827 B2 | * | 4/2003 | Abiko | 438/183 |
| 6,589,866 B1 | | 7/2003 | Besser et al. | |
| 2003/0122202 A1 | | 7/2003 | Kwon | |

OTHER PUBLICATIONS

S.B. Samavedam et al., "Silicon Materials—Processing, Characterization and Reliability Symposium," *Mater. Res. Soc. Proc.*, vol. 716, 2002, pp. 85–90.
K. T. Nishinohara et al., "Regular Papers Short Notes & Review Papers" *Japan Jnl. App. Phys. Ltrs*, pt 1, v. 40, 2001, pp. 2603–2606.
F. F. Zhao et al., "Silicon Materials—Processing, Characterization and Reliability Symposium," *Mater. Res. Soc. Proc.*, vol. 716, 2002, pp. 41–46.
W. T. Liaw et al., "Letters" *Japan Jnl. App. Phys. Ltrs*, pt 2, v. 36, n. 2A, 1997, pp. L89–L92.

* cited by examiner

*Primary Examiner*—David Nhu
(74) *Attorney, Agent, or Firm*—Daryl K. Neff; H. Daniel Schnurmann

(57) ABSTRACT

A structure and method are provided for fabricating a field effect transistor (FET) having a metal gate structure. A metal gate structure is formed in an opening within a dielectric region formerly occupied by a sacrificial gate. The metal gate structure includes a first layer contacting a gate dielectric formed over a semiconductor region of a substrate. The first layer includes a material selected from the group consisting of metals and metal compounds. The gate further includes a silicide formed over the first layer. The FET further includes a source region and a drain region formed on opposite sides of the gate, the source and drain regions being silicided after the first layer of the gate is formed.

15 Claims, 13 Drawing Sheets

STRUCTURE AND METHOD FOR SILICIDED METAL GATE TRANSISTORS

BACKGROUND OF INVENTION

The invention relates to a semiconductor processing methods and structures, and more particularly to a structure and method for forming metal gates of transistors, especially for transistors in complementary metal oxide semiconductor (CMOS) technology.

Polysilicon gate electrodes have been a preferred material for the manufacture of gate electrode because of the special characteristics of polysilicon, particularly thermal robustness and the greater patterning precision available for etching a polysilicon gate. Many fabrication steps, such as annealing processes, require extremely high processing temperatures and therefore it is important to have a polysilicon gate withstands high temperatures during the fabrication process. Polysilicon gates are capable of withstanding high temperature processing of other elements of transistors such as source and drain regions during dopant drive-ins. In addition, precise edges can be defined on polysilicon gates when etching a layer of polysilicon according to a resist pattern.

However, polysilicon gates have several disadvantages. Polysilicon is not a very good conductor of electricity, a quality which makes polysilicon transistors operate at slower speeds. Furthermore, a polysilicon gate is subject to the formation of a depletion region in operation in which charge carriers are depleted from the gate material above the gate dielectric. This varies from a metal electrode in which charge carriers remain plentiful throughout the electrode. The depletion region has the effect of making the gate dielectric appear thicker in operation than it actually is, such that more charge is needed to turn on the transistor having the polysilicon gate than the transistor having the metal gate. Consequently, in recent years, alternatives for replacing polysilicon gates have been considered.

Metals have long been a preferred material for manufacture of transistor gates since metals are better conductors of electricity, resulting in reduced gate contact resistance and faster device performance. However, manufacturing of metal gates has been previously avoided because of difficulties in fabrication. For one, metal gates are not as thermally robust as polysilicon, responding poorly to high temperatures during processing of transistors or other elements of integrated circuits (ICs). In addition, metal gates cannot withstand the oxidation ambient present during some steps of gate fabrication such as gate sidewall spacer formation and/or gate sidewall oxidation. Furthermore, patterning accuracy required in gate formation is reduced when performing photolithography or other similar techniques on metal surfaces. Planar surfaces, which are a requirement for photolithographic patterning accuracy, are not easily obtainable in metals.

In recent years, there has been greater interest in the fabrication of metal gates, due at least in part to the development of a new approach. In this new approach, a sacrificial polysilicon gate is first formed, which is used during initial high temperature processing of the transistor and which is later replaced by metal gate structure. By this replacement gate process, initial severe transistor processing conditions such as high temperatures need not be modified, and the photolithography benefits associated with polysilicon processing are preserved. Moreover, the initial use of a sacrificial polysilicon gate is benefited by the ability of polysilicon to block ion-implantation to the channel region of the transistor when performing source and drain implants to the transistor.

Metal gates are advantageously used in CMOS transistors including p-type field effect transistors (PFETs) and p-type field effect transistors (NFETs). In such transistors, the channel dopant profile requires a high dopant concentration near the gate dielectric with a sharp drop in concentration elsewhere in order for the gate to have good control over the channel. This requires that the transistors have a heavily doped shallow region under the channel. Such doping is typically obtained by implanting and annealing at a high temperature or by dopant drive-in at a high temperature.

A major challenge in fabricating such transistors is to perform the implant and anneal (or dopant drive-in at high temperature) in a suitable order relative to other steps used to form the transistors. The channel profile has to be established sometime after the sacrificial polysilicon gate is removed but before the metal gate is formed in its place. Adding to the complexity of transistor fabrication, a layer of silicide may be formed over the source and drain regions of the transistor to enhance transistor performance. Suicides of some metals, particularly cobalt and nickel, are intolerant of high temperature processing, thus adding to the difficulties in fabricating such transistors.

These and other difficulties of fabricating metal gates present challenges to be overcome. Improved structures and fabrication methods are needed that can address current fabrication challenges and enhance the overall performance of metal gates.

SUMMARY OF INVENTION

According to an aspect of the invention, a structure and method are provided for fabricating a field effect transistor (FET) having a metal gate structure. A metal gate structure is formed in an opening within a dielectric region formerly occupied by a sacrificial gate. The metal gate structure includes a first layer contacting a gate dielectric formed over a semiconductor region of a substrate. The first layer includes a material selected from the group consisting of metals and metal compounds. The gate further includes a silicide formed over the first layer. The FET further includes a source region and a drain region formed on opposite sides of the metal gate structure. Preferably, the source region and drain region are silicided. The silicide on the source and drain regions is preferably formed by the same process in which the silicide is formed over the first layer of the metal gate structure.

According to a preferred aspect of the invention, the silicide layer is formed in a self-aligned manner from a layer of silicon overlying the first layer of the metal gate structure and a layer of metal deposited over the layer of silicon. An underlying layer of silicide may be formed at an interface between the first layer and the layer of silicon.

DETAILED DESCRIPTION

The present invention provides a way of forming a silicide on the source and drain regions of PFETs and NFETs by a self-aligned technique after forming metal gates of such transistors which does not damage the structure of the metal gate.

The present invention particularly addresses and solves problems associated with the fabrication of metal gates according to the prior art. In particular, the present invention provides transistors having a metal gate wherein a self-aligned silicide is formed on the source and drain regions and over a first layer of the metal gate structure. A feature of the invention is that the salicide is simultaneously formed over the metal gate, thus avoiding process complexity but without adversely affecting the characteristics of the metal gate.

A feature of the invention is the performance of the silicidation step at a time after processing at high temperatures (i.e. 500 deg. C and above) such that the silicide layer is not damaged by high temperature processing. The silicidation step is conducted in a manner to avoid damage to the gate during subsequent etching procedures. These and other features of the invention will now be discussed in greater detail as follows.

Figure 1:
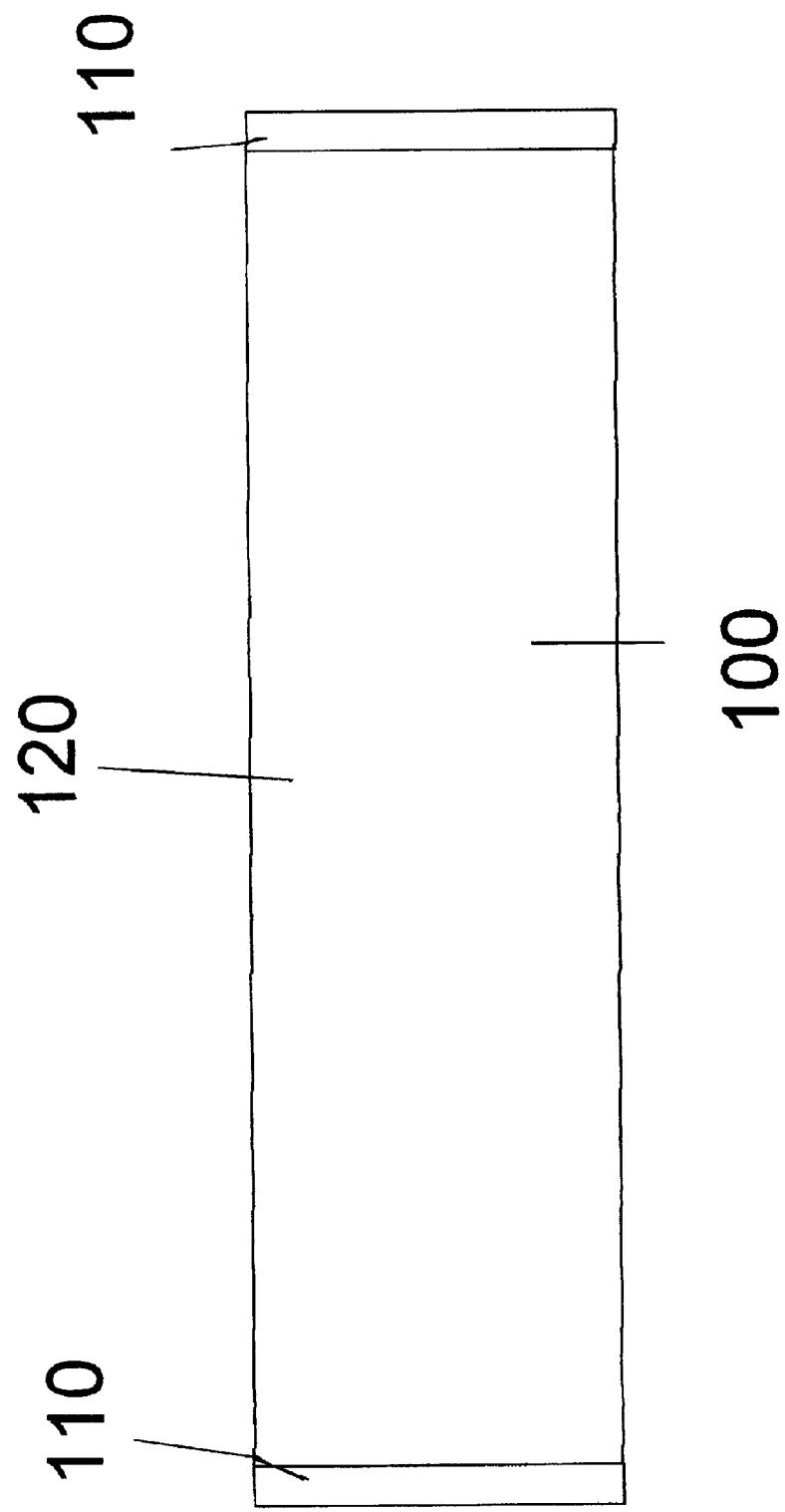
FIGS. 1 though 13 are cross-sectional views illustrating stages in a processing method according to an embodiment of the present invention.

FIG. 1 is a sectional view illustrating a stage in a fabrication method according to an embodiment of the present invention. FIG. 1 illustrates a semiconductor substrate 100. The term "substrate" is used herein for ease of reference and includes a variety of types of substrates including bulk semiconductor substrates, semiconductor-on-insulator substrates such as "silicon-on-insulator" (SOI) substrates, germanium (Ge) substrates, strained silicon/silicon germanium (SSi/SiGe) substrates and silicon germanium (SiGe) substrates. Such substrates include a region of a single-crystal semiconductor at a main surface thereof. The term substrate may also be applied to a substrate having a thin deposited semiconductor layer when the process described herein is used to form a thin film transistor (TFT).

Isolation structures as shown at 110 are then formed on the substrate 100. These isolation structures 110 can include a variety of structures such as shallow trench isolation and are formed selectively on the substrate 100. The area of the substrate defined by and in between the isolation structures 110 is known as the active area and is shown in FIG. 1 at 120. The active area 120 will house the active electrical devices. The purpose of the isolation structures is to provide electrical isolation between devices in various and particularly adjacent active areas 120.

Figure 2:
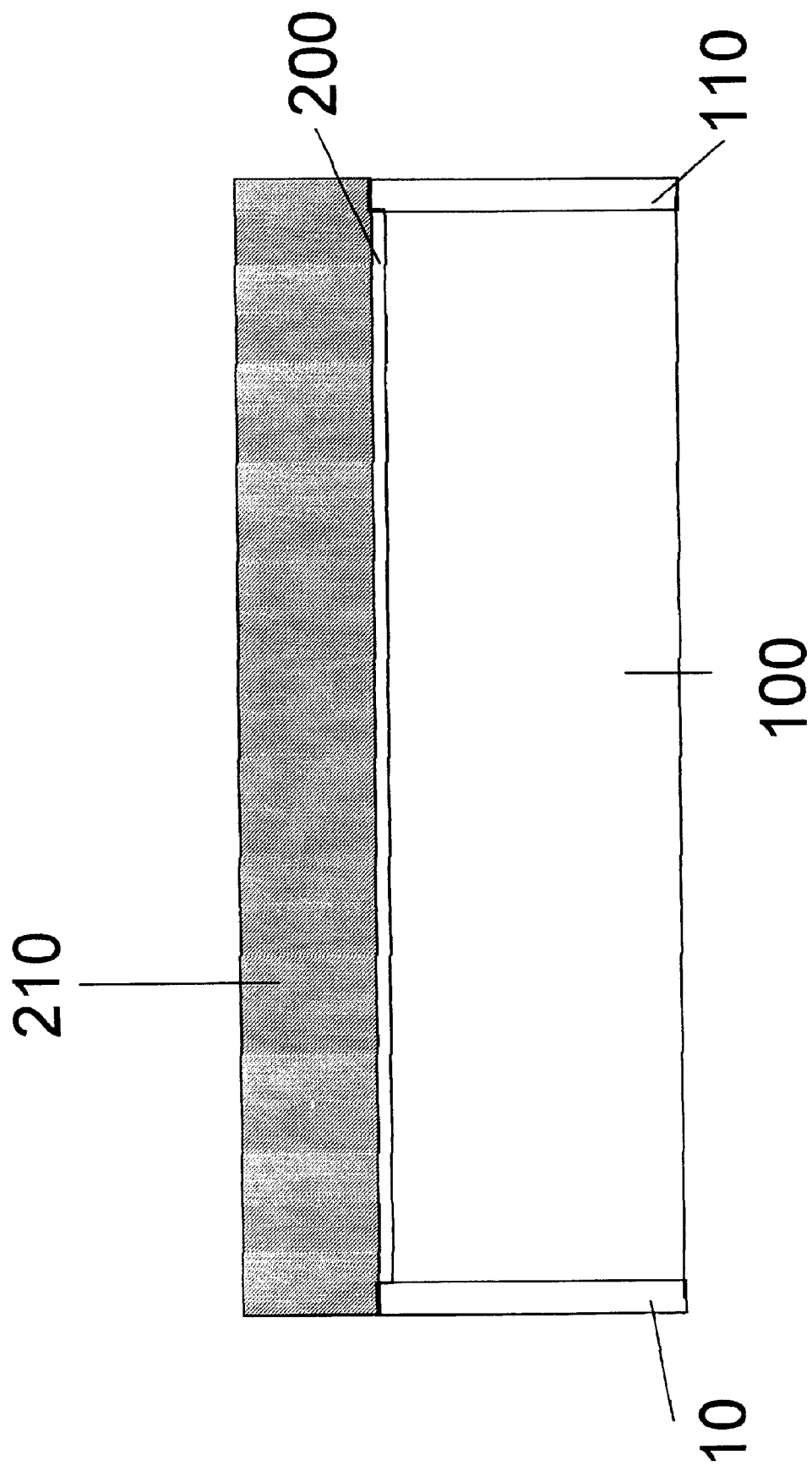

FIG. 2 illustrates a next processing stage in which initial process steps are conducted to form a sacrificial polysilicon gate on the substrate 100. As shown in FIG. 2, an etch stop layer 200 is formed by deposition or grown on the substrate 100. In a preferred embodiment, the etch stop layer 200 includes an oxide such as silicon dioxide. Alternatively, the etch stop layer may include a nitride such as silicon nitride, silicon oxynitride or other similar material. As shown in FIG. 2, a layer 210 of polysilicon is then deposited as a sacrificial gate material on the etch stop layer 200.

Figure 3:
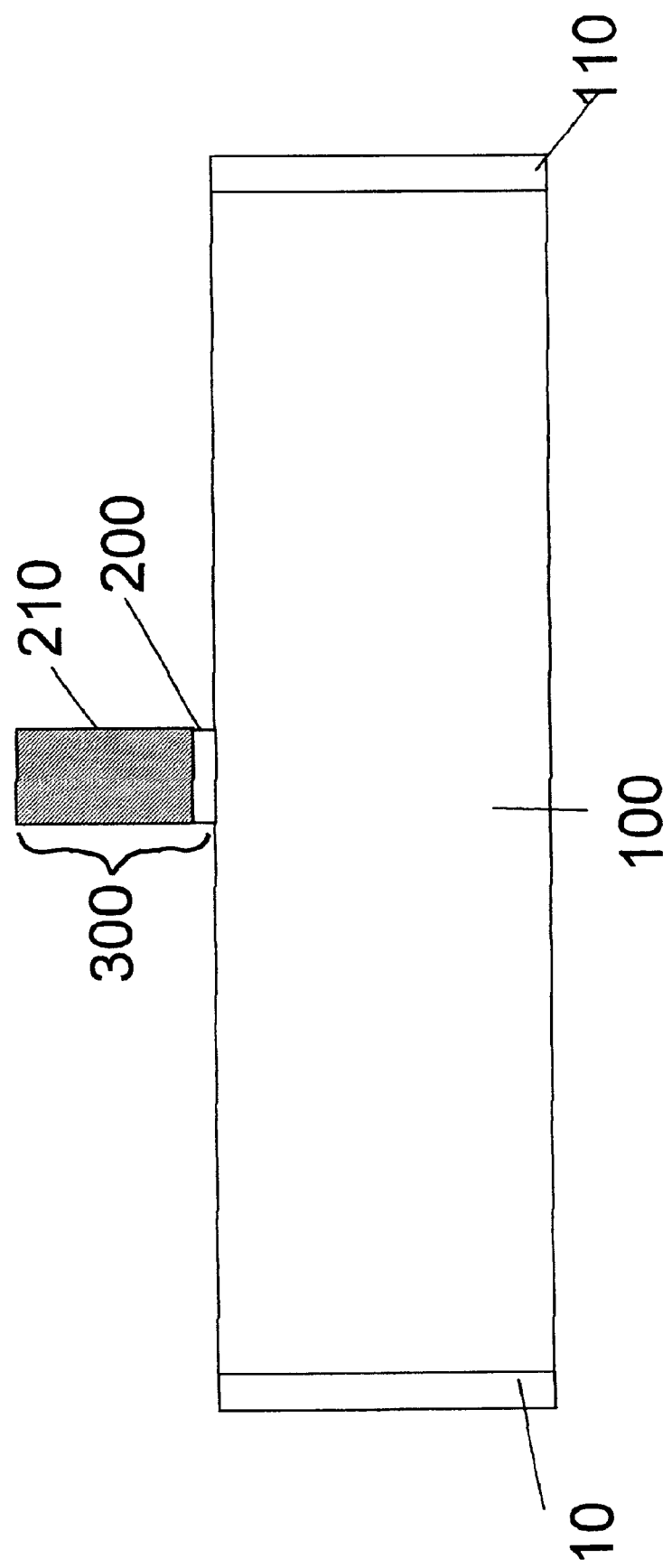

As shown in FIG. 3, the sacrificial gate material 210 and the etch stop layer 200 are patterned together. Since the sacrificial gate is formed of polysilicon, as is widely used in NFET and PFET transistors, patterning processes are readily available.

Photolithographic imaging followed by etching is used to pattern the gate stack 300 including the etch stop layer (illustratively provided as an oxide layer 200) and the polysilicon 210. Etching can be performed by an anisotropic etch process such as a reactive-ion plasma etch (RIE), for example.

Figure 4:
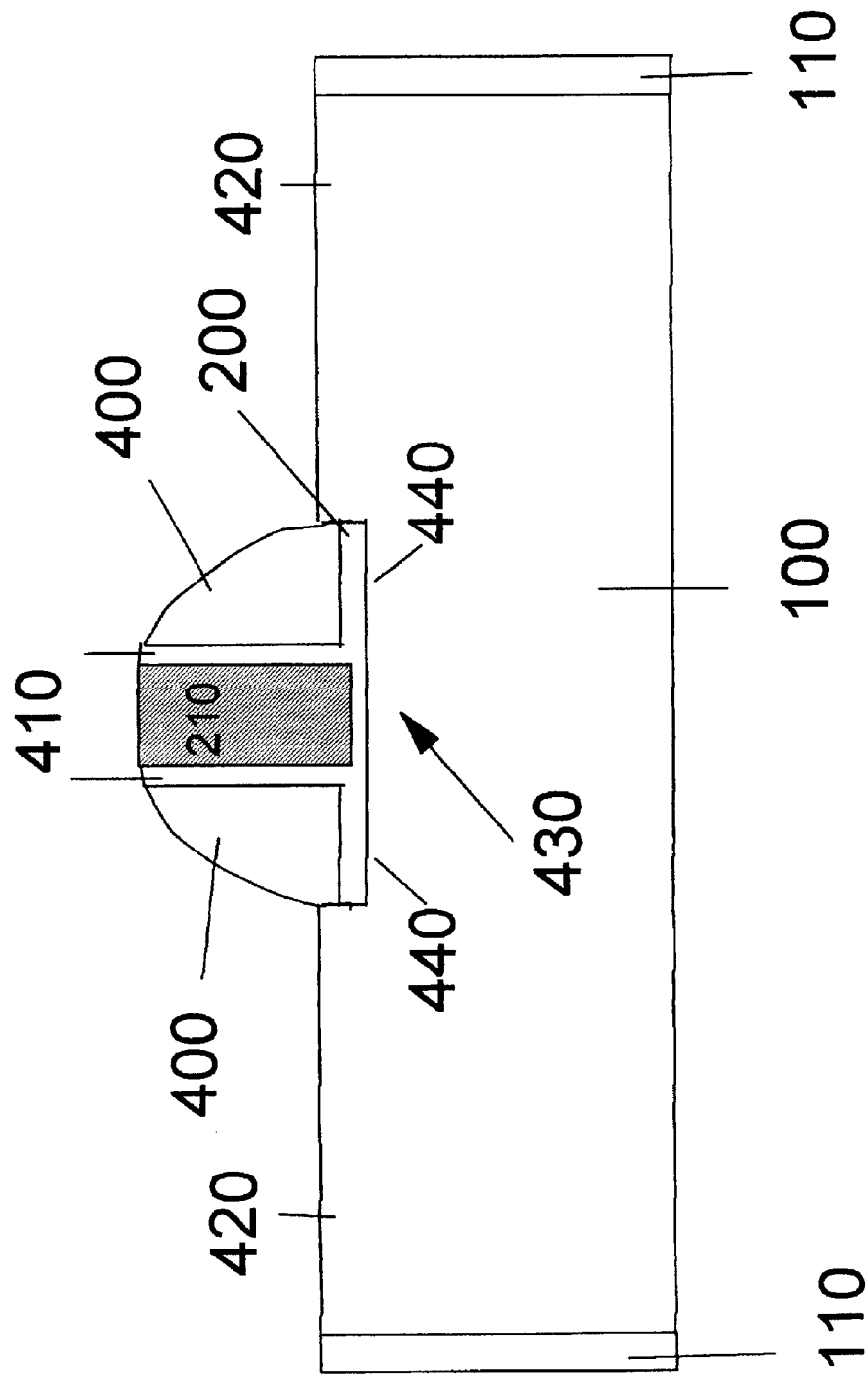

In the next processing step, spacers 400 are formed on the sidewalls of the gate stack structure, as shown in FIG. 4. In a preferred embodiment, the spacers 400 are formed of a nitride such as silicon nitride. Preferably, L-shaped spacers 410 are provided underlying the spacers 400. The L-shaped spacers are preferably formed by depositing a first layer of material, preferably a layer of oxide, on gate stack 300 and substrate 100. A second layer of material is then deposited over the first layer of material. The second layer of material is preferably a nitride such as silicon nitride. An anisotropic vertical etch such as RIE is then used to remove the first and second layers of material except where they collectively coat sidewalls of the sacrificial gate, to produce the structure including spacers 400 and 410 that is shown in FIG. 4.

FIG. 4 also illustrates a process of forming the source and drain regions as shown at 420. Raised source and drain regions are now formed by selectively growing an epitaxial layer of silicon in areas 420 on the surface of the substrate 100. During this step, the sacrificial gate 210 and spacers 400, 410 prevent the epitaxial layer from being grown onto the channel region 430 of the substrate 100.

Thereafter, ion implantation into the source and drain regions is performed separately to define NFETs and PFETs. During this step, areas of the substrate 100 in which PFETs are to be formed are masked while source and drain regions of the NFETs are implanted. Likewise, areas of the substrate in which NFETs are formed are masked when the source and drain regions of the PFETS are implanted.

The regions shown at 440 in FIG. 4 can also be implanted to form lightly doped source/drain extension regions and/or halo implanted regions. The extensions as shown at 440 and halo implantation can be formed by dopant ion implantation before spacer 400 is formed. In addition, either or both n-type and p-type impurities can be implanted as needed to form the specific desired components. In a preferred embodiment where complementary metal oxide semiconductor (CMOS) technology is n-type dopants and p-type dopants must be implanted into respective portions of the substrate to form the source and drain regions of the NFETs and the PFETs. A sufficiently thick layer of polysilicon has the ability to block ion implantation into underlying layers. The sacrificial polysilicon gate 210 and the spacers 400, 410 function together as an implant mask during ion implantations to form the source and drain regions.

The use of a sacrificial polysilicon gate in these early stages of processing a metal gate allows high temperature processing to be performed. For example, a high temperature dopant drive-in process is generally required following implanting a dopant into source and drain regions of the substrate after patterning the gate.

Figure 5:
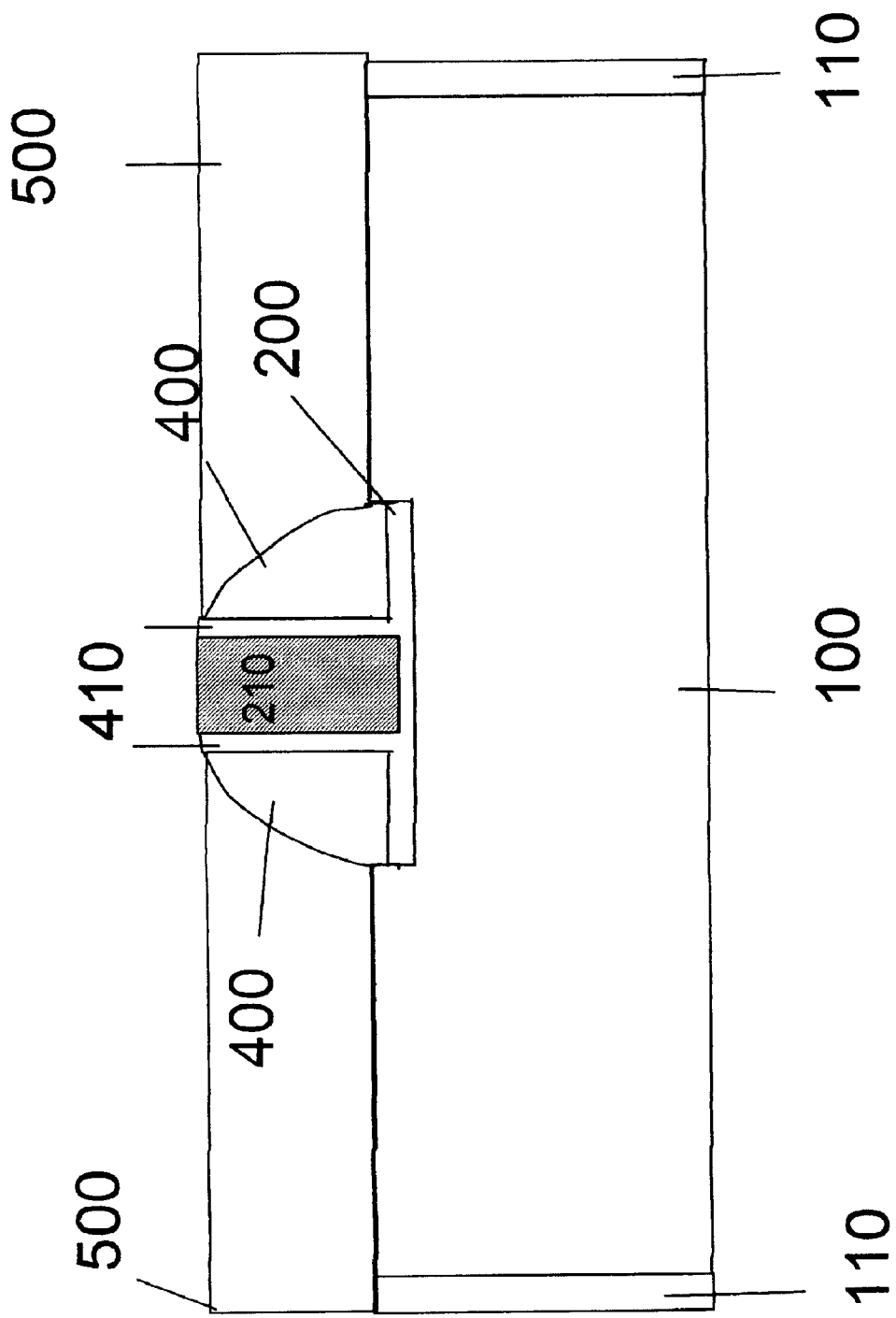

Next, as shown in FIG. 5, an interlevel dielectric layer 500 is blanket deposited over the substrate 100. In a preferred embodiment, the interlevel dielectric material includes silicon dioxide ($SiO_2$). Preferably, the interlevel dielectric 500 is planarized, stopping at the sacrificial polysilicon 210. A variety of processes are available for planarization such as chemical mechanical polishing (CMP).

Figure 6:
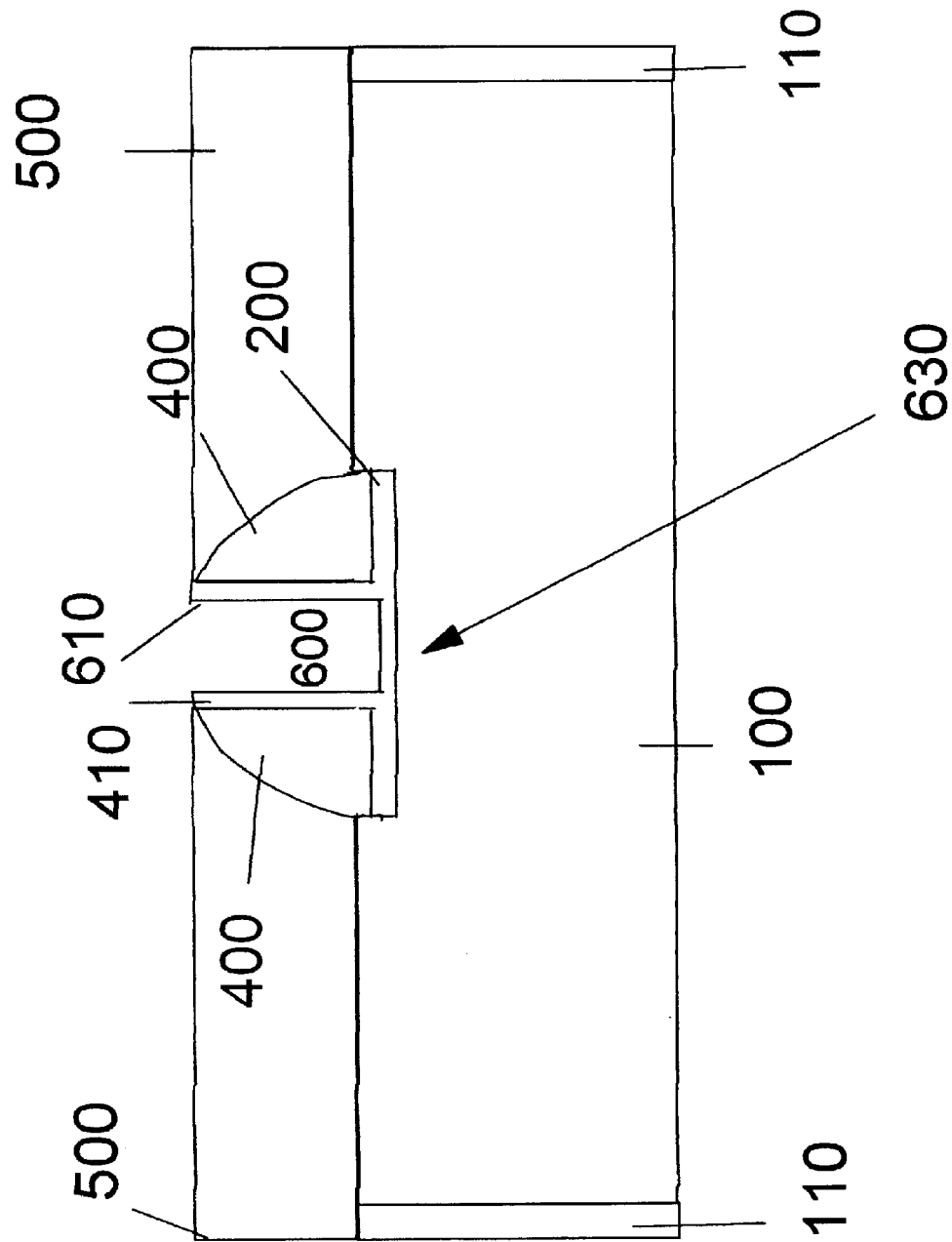

As shown in FIG. 6, the sacrificial gate 210 is then removed, as by RIE, stopping on the etch stop layer 200 so as to avoid damaging the surface of the substrate 100 under which the conduction channel 630 of the transistor will be formed. As a result, as shown in FIG. 6, an opening 600 is formed, bound by the etch stop layer 200 and the sidewalls 610 of the L-shaped spacers 410.

Once the sacrificial gate 210 has been removed, a shallow threshold voltage adjustment implant can be performed through the etch stop layer 200. Thereafter, an anneal is performed to diffuse the dopant ions to the desired distribution and to repair damage to the crystal structure of the substrate 100 as a result of the implant. Then, the etch stop layer 200 is removed, as by a dry directional etch selective to silicon and to nitride such as RIE.

Figure 7:
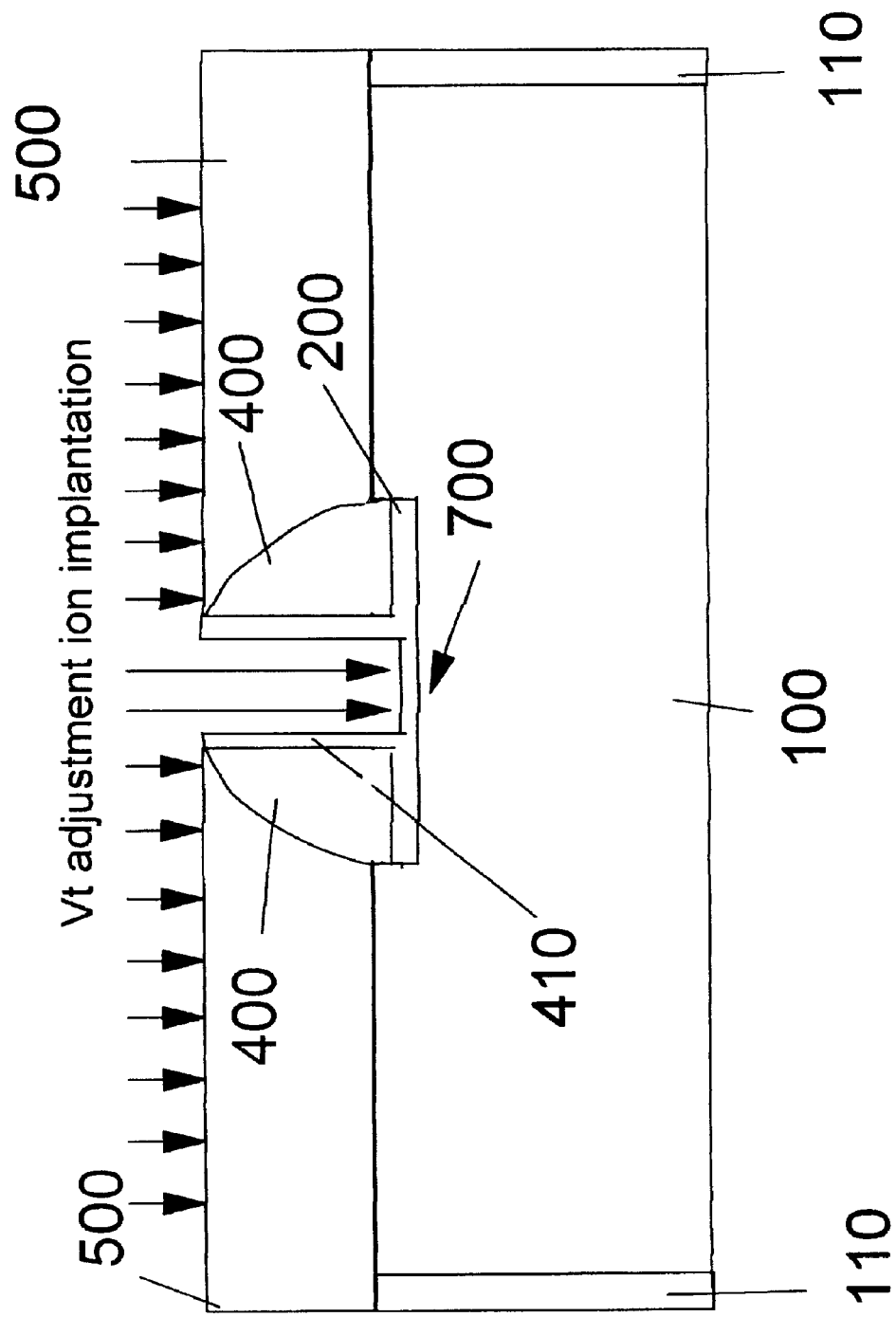

Alternatively, a doped glass drive-in process is used to provide the threshold voltage adjustment to the transistor's conduction channel. In such process, the etch stop layer 200 is removed, as by a dry directional etch such as RIE. A thin layer of dopant material such as arsenic doped glass (if an n-type implant is desired) or borosilicate glass (if a p-type implant is desired) is then deposited onto the surface 700 of substrate 100 in the place of the etch stop layer 200 within the opening 600, as shown in FIG. 7. Thereafter, the dopant is distributed to the desired depth and distribution through a drive-in anneal. The doped glass material is then removed from the opening 600, as by a dry directional etch.

Figure 8:
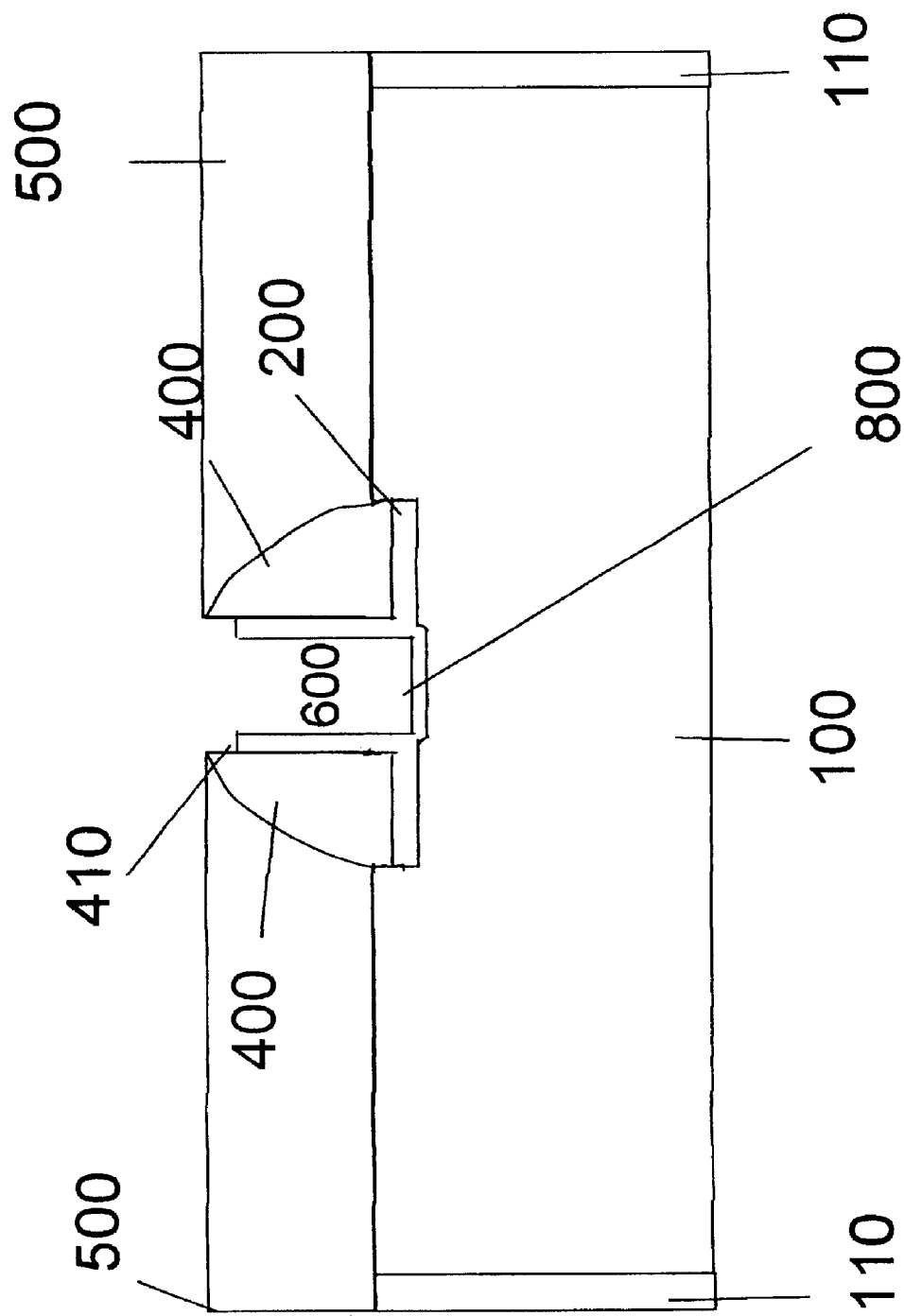

Whichever process is used to provide the threshold voltage adjustment, the surface 700 of the substrate is now cleaned and the final gate dielectric 800 is now formed in the opening 600, as shown in FIG. 8. In an embodiment, the gate dielectric 800 includes an oxide layer and is thermally grown on the substrate 100 within the opening 600. In another embodiment, the gate dielectric 800 is formed by deposition, as by low pressure chemical vapor deposition (LPCVD) of a material such as silicon dioxide, silicon nitride, or silicon oxynitride. Other choices of materials exist for the gate dielectric. For example, a gate dielectric of hafnium oxide ($HfO_2$) or of zirconium oxide ($ZrO_2$) can be formed as a gate dielectric having a desirably high dielectric constant K, higher than that of either silicon dioxide, silicon nitride or silicon oxynitride. Such high-k gate dielectric may be advantageous for a particular application, such as where a thicker gate dielectric is needed to protect against dielectric breakdown but without sacrificing transistor switching performance.

Figure 9:
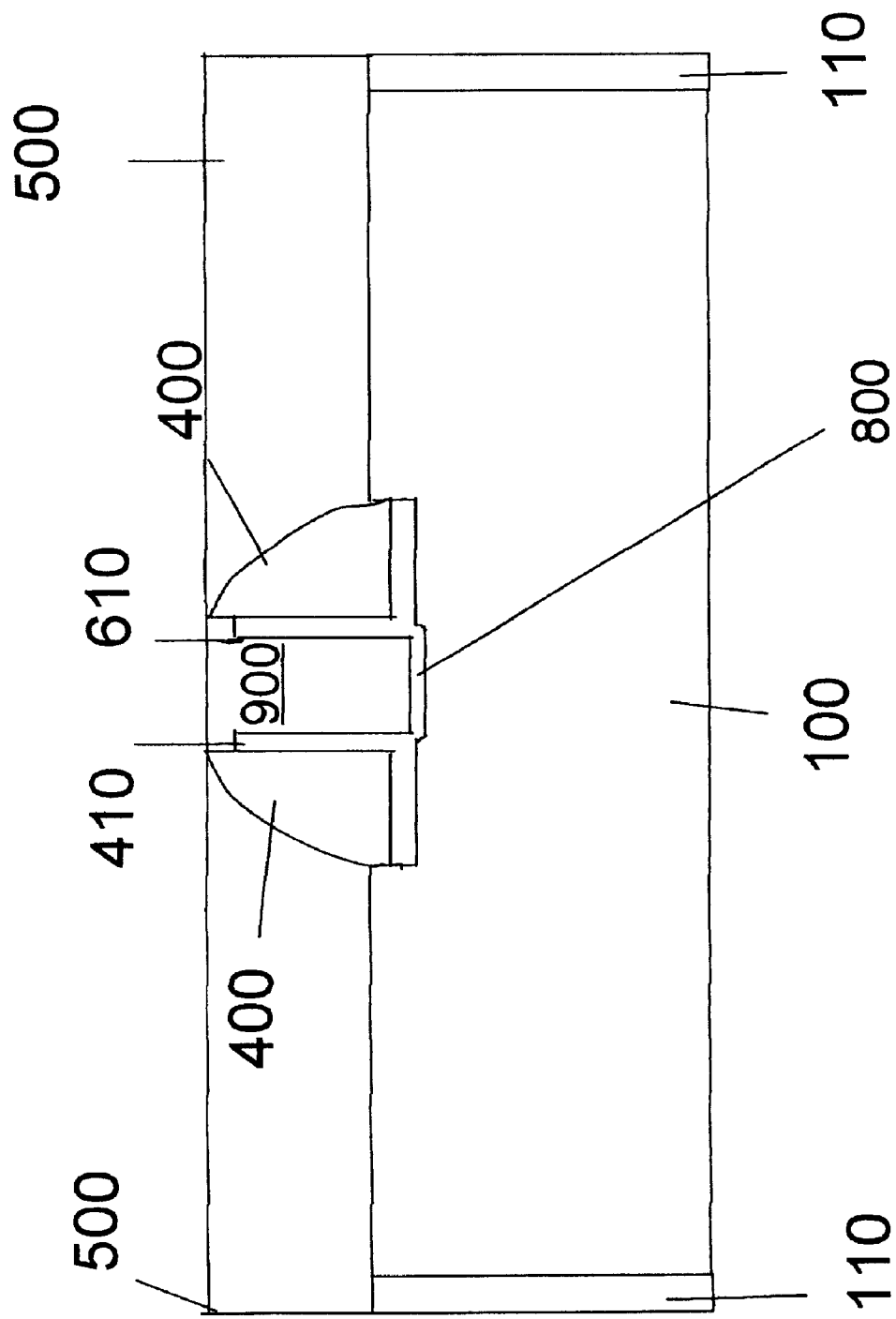

FIG. 9 illustrates a stage in formation of the metal gate structure including a metal gate layer 900. In the embodiment illustrated in FIG. 9, tungsten (W) is used as a preferred material for a metal gate layer 900. One or more metals and/or compounds of metals can be used to form the metal gate layer 900 such that the metal gate layer 900 may include only one or more metals, or only one or more compounds of metals, or, alternatively a combination of metal(s) and metal compound(s). In an example, the metal gate layer 900 may preferably include a metal such as tungsten which has a workfunction at about the middle bandgap of silicon. In another example, the metal gate layer 900 may include tungsten silicide. While the layer 900 may include a compound of a metal, reference will be made hereinafter to a "metal gate layer." The metal gate layer 900 is first deposited in the opening shown previously as 600. Then, in a preferred embodiment, the metal gate layer is planarized to the level of the interlevel dielectric 500 using chemical mechanical polishing (CMP).

Next, processing to form silicides in the source and drain regions and contacting the gate is performed. The present invention provides a way of forming self-aligned silicides in the source and drain regions of the transistors at a timing that does not interfere with other required processes or the quality of the completed transistors. As discussed above, in forming p-type field effect transistors (PFETs) and n-type field effect transistors (NFETs), it is desirable to perform shallow implants into the channel regions of the transistors in order to adjust the threshold voltages to desirable levels. High temperature processing is required in order to anneal the channel regions of PFET and NFET transistors following the shallow threshold voltage adjustment implants. However, if the source and drain regions of the transistors are silicided prior to such high temperature processing, device degradation can result. Many annealing processes require temperatures of over 800 degrees Celsius. Many silicides, including nickel silicide (NiSi), are unstable above temperatures of 500 degrees Celsius. Therefore, such silicides should not be formed prior to completing such high-temperature processing.

Consequently, it is desirable to form a silicide in the source and drain regions of the transistors after implanting and annealing the channel region. However, an opportunity to silicide the source and drain regions after annealing the channel region is not presented until after the metal gate is fully formed. This presents a problem. If the silicide is to be formed by a self-aligned technique, a deposited metal has to reacted with the silicon in contact therewith to form the silicide. The excess unreacted metal must then be subsequently removed, i.e. etched away selective to the silicide and dielectric materials that are present. However, unless the metal of the underlying metal gate is somehow protected, this etch to remove the unreacted metal could damage the metal gate.

Figure 10:
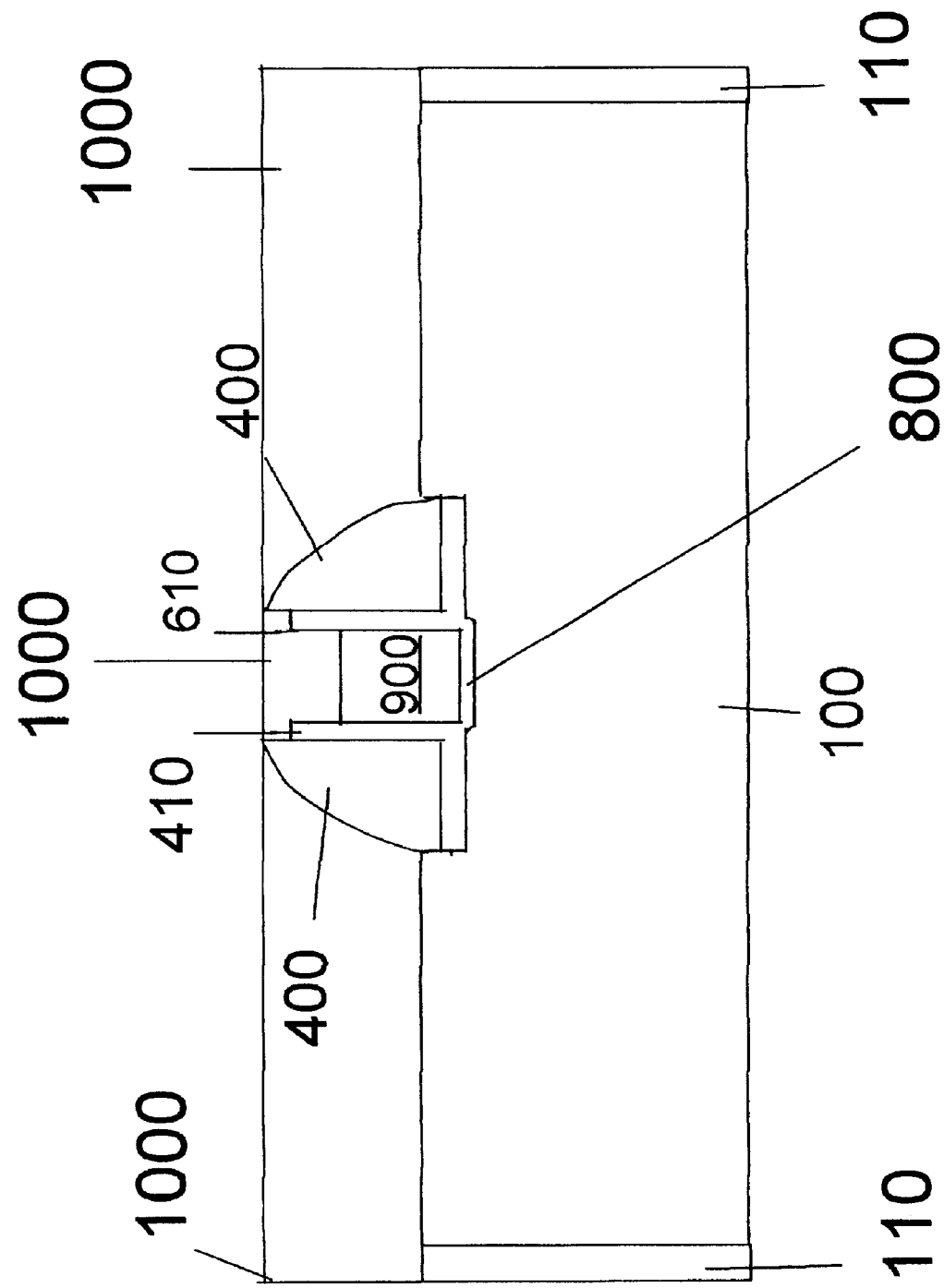

These concerns are addressed by the present invention as follows. An intervening layer of silicon is formed over the metal gate layer 900 as a way of protecting the metal gate layer 900 such that the silicide can be formed thereafter using a self-aligned technique. Thus, in the next stage of processing, illustrated in FIG. 10, the metal gate layer 900 is recessed within opening 600 to provide space between spacers 410 for the formation of a silicon layer 1000. In a preferred embodiment, the metal gate layer 900 is recessed by removing, preferably 20 nm to 50 nm of metal. The metal gate layer 900 is preferably recessed using dilute hydrogen peroxide ($H_2O_2$) but other techniques may be utilized as well, such as a dry etch technique.

After recessing the metal gate layer 900, a doped silicon layer 1000 is then deposited over the metal gate layer 900. In a preferred embodiment of the present invention, the layer of silicon 1000 comprises a layer of polysilicon (p-Si) or amorphous silicon (a-Si). In one such embodiment the p-Si or a-Si is then doped in-situ, using either n-type or p-type dopants, to reduce the gate resistance but without affecting the threshold voltage (Vt) of the transistor including the gate. The silicon layer 1000 is then subsequently lowered to the level of the interlevel dielectric 500, preferably through planarization by chemical mechanical polishing (CMP).

Figure 11:
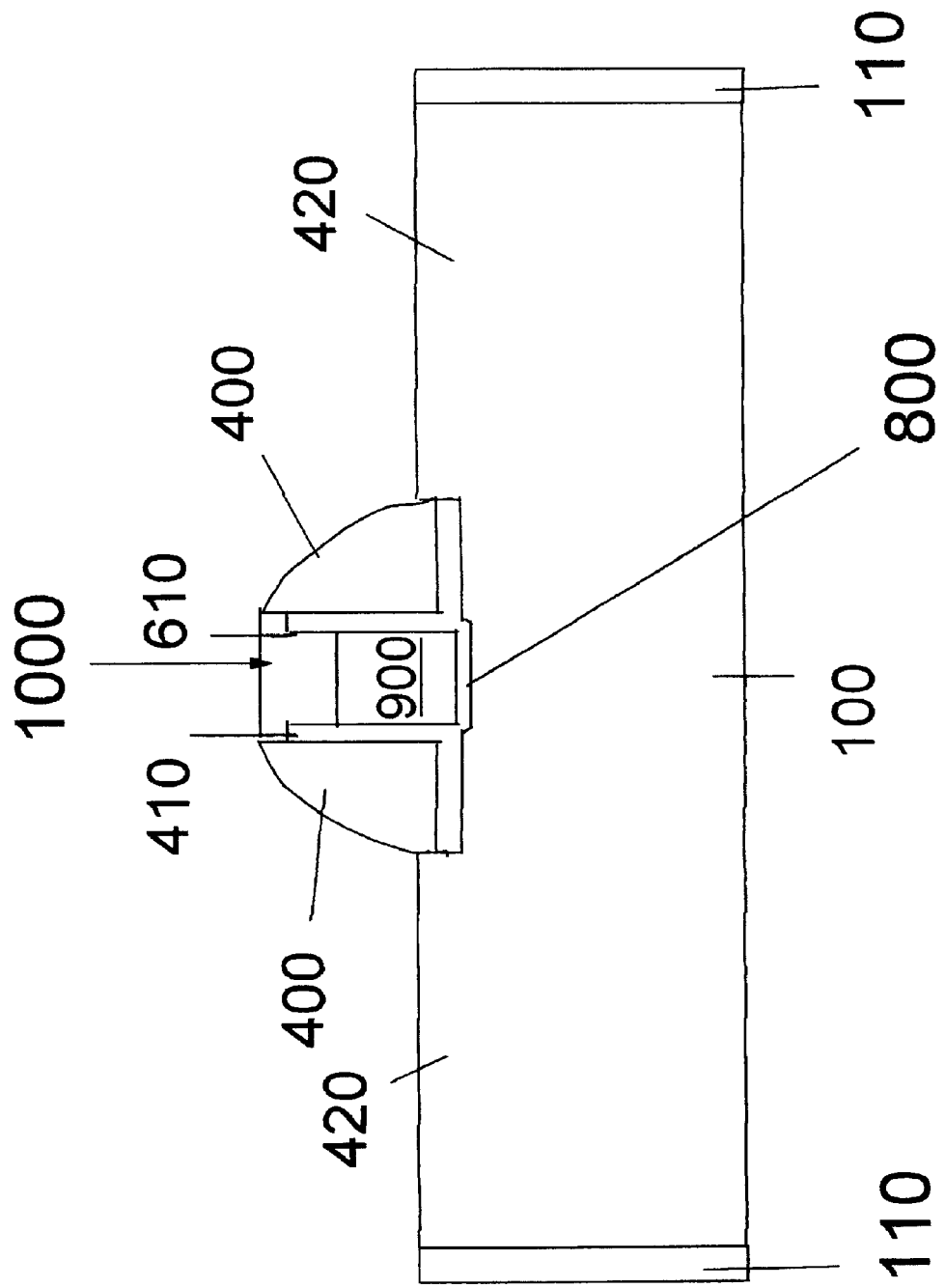
Figure 12:
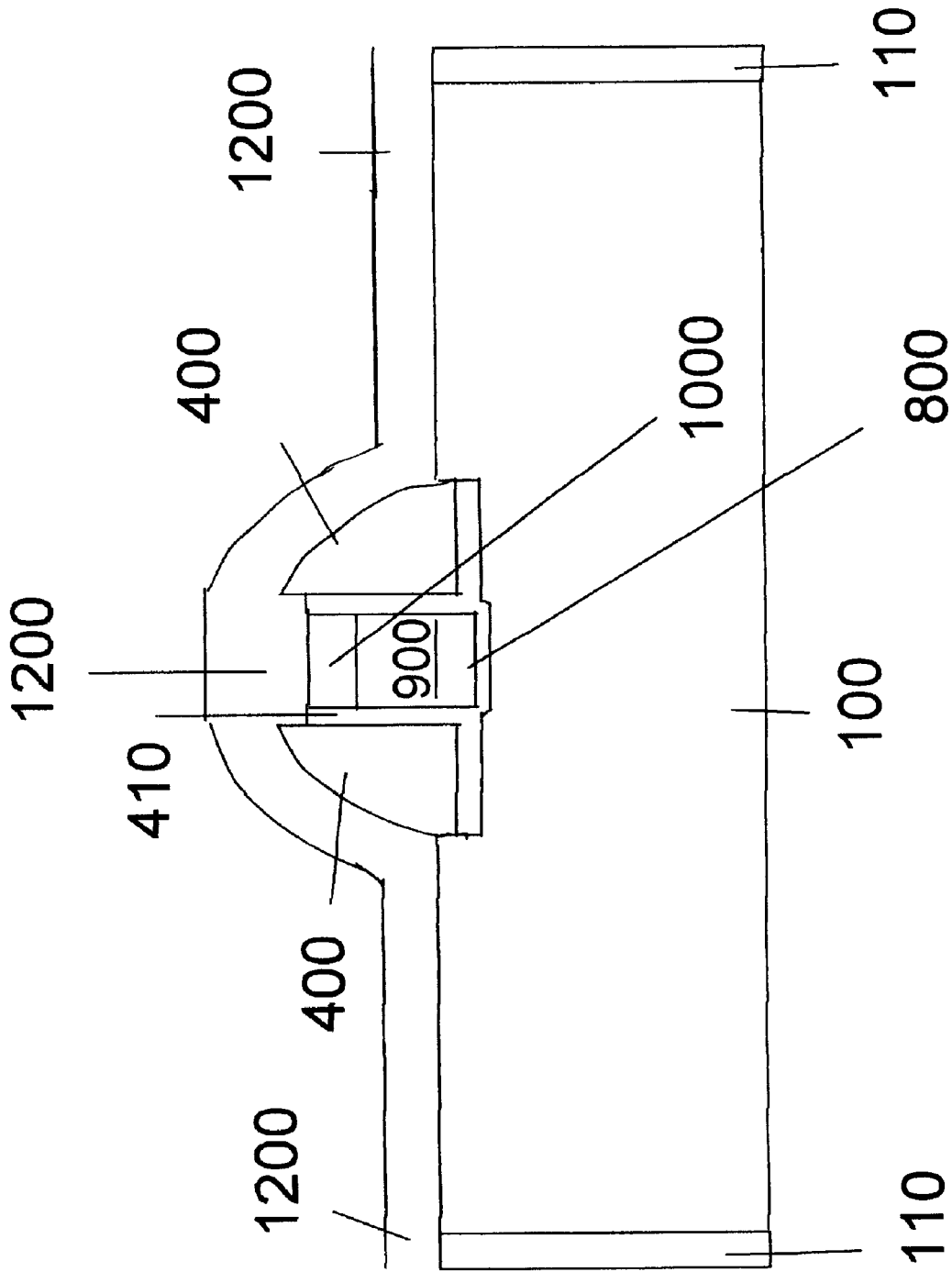
Figure 13:
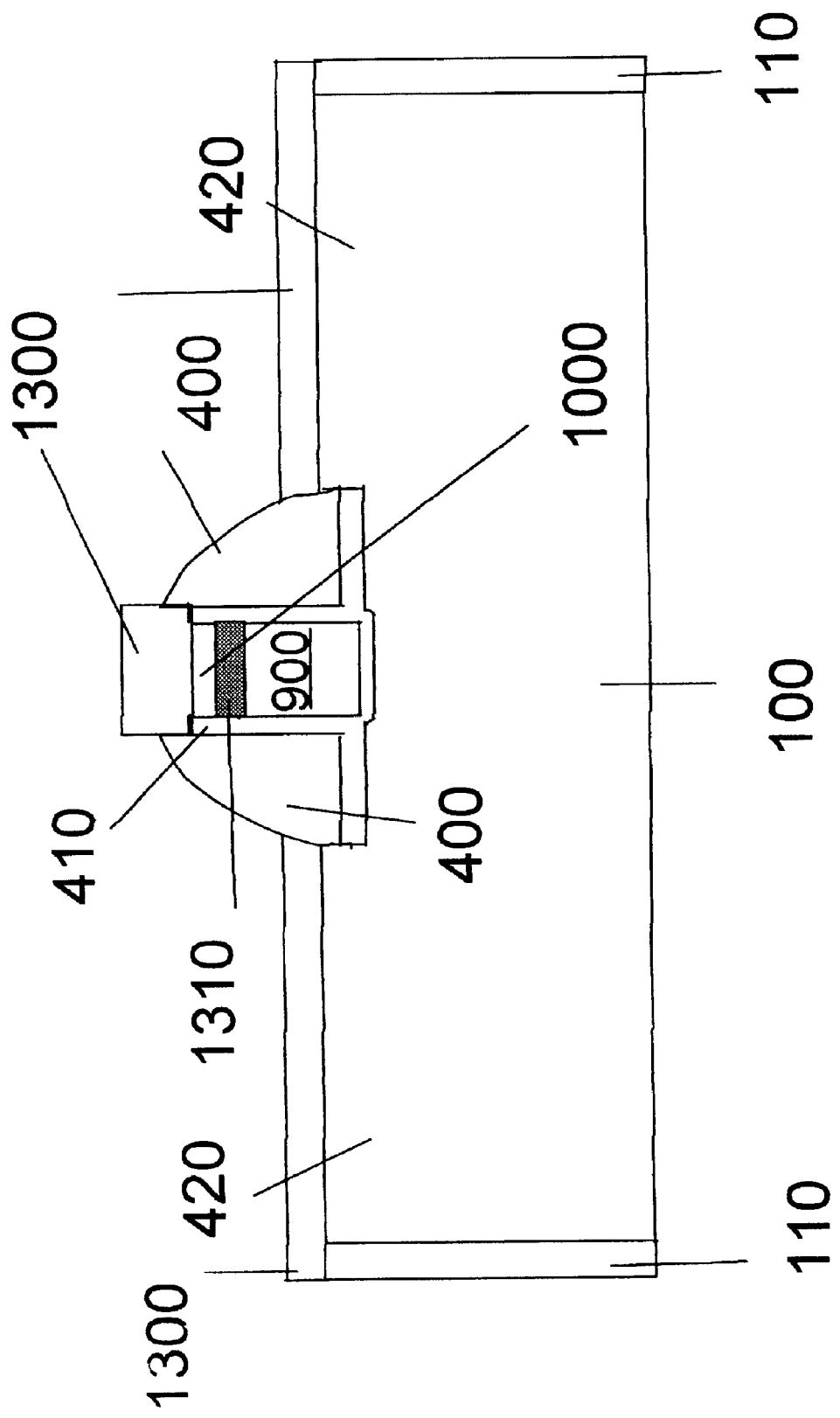

The process by which the silicide is formed is now described, with reference to FIGS. 11 through 13. FIG. 11 illustrates a further stage in processing during which the interlevel dielectric 500 is removed to expose the source/drain regions 420. As illustrated in FIG. 12, a second metal layer 1200 is conformally deposited. The second metal layer 1200 is deposited in a manner so that a thin layer of metal is deposited on the substrate 100, the spacers 400 and the doped silicon layer 1000. The second metal layer 1200 preferably includes cobalt or nickel. Alternatively, a metal such as platinum or titanium could be used instead. An anneal is then performed to react the metal layer 1200 with the silicon of the source and drain regions 420 and the silicon layer 1000 of the gate to form a self-aligned silicide 1300. In such embodiments, when the deposited second metal layer 1200 is cobalt, the annealing process to form $CoSi_2$ as the silicide 1300 is usually conducted within a temperature range of 600 to 750 degree Celsius. Alternatively, when the deposited second metal layer 1200 is nickel. The annealing process to form NiSi as the silicide 1300 is conducted within a temperature range of 400 to 500 degrees Celsius. When the deposited second metal layer is titanium, the annealing process to form TiSi$_2$ as the silicide 1300 is conducted within a temperature range of 500–750 C. When the deposited second metal layer is platinum, the annealing process to form PtSi as the silicide 1300 is conducted within a temperature range of 450–800C.

When the metal gate layer 900 is a metal which reacts with silicon to form a silicide, the annealing process also forms a silicide layer between the metal gate layer 900 and the doped silicon layer 1000. In embodiments in which tungsten is used as the metal gate layer 900, this results in the formation of a tungsten silicide (WSi$_2$) layer.

Subsequent to the annealing process, a selective etch is performed to remove excess unreacted metal from all areas except where a layer of silicide is formed. In such manner, excess metal 1200 is removed from areas contacting the spacers 400. The resulting structure is shown in FIG. 13.

As shown in FIG. 13, a metal silicide 1300 is provided on the source and drain regions 420 on the substrate 100. There is also a layer of silicide 1300 on top of the doped silicon 1000. A silicide layer 1310 is also formed between the metal gate 900 and the doped silicon layer 1000. The doped silicon layer 1000 will be hereinafter referenced as intervening layer.

During annealing to form the self-aligned silicide 1300, the doped silicon layer 1000 may actually be fully consumed by reactions with a metal of the underlying metal gate layer 900 and with the second metal layer 1200 to form the two silicide layers 1310 and 1300. In such case, the two silicide layers 1310 and 1300 merge with each other.

In still another embodiment, when the metal gate layer 900 is a silicide material or a material that does not form a silicide in contact with silicon, the silicide layer 1310 will not appear after annealing. In such embodiment, depending on the relative quantities of material in the doped silicon layer 1000 and the second metal layer 1200, the annealing process to form the silicide 1300 may or may not fully consume the doped silicon layer 1000.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of fabricating a field effect transistor (FET) having a metal gate structure, comprising:
    forming a structure including a metal gate structure, a source region, and a drain region, said metal gate structure formed in an opening within a dielectric region formerly occupied by a sacrificial gate, said source region and said drain region being disposed on opposite sides of said metal gate structure, and said metal gate structure including:
        a first conductive layer including one or more materials selected from the group consisting of metals and compounds of metals, said first conductive layer separated from a transistor channel region of a substrate by a thickness of a gate dielectric; and
        an overlying conductive silicide layer overlying said first conductive layer.

2. The method of claim 1 wherein said step of forming said metal gate structure includes depositing a layer of silicon over said first conductive layer, depositing a layer of metal over said layer of deposited silicon, and reacting said deposited silicon with said deposited metal to form said overlying silicide layer in a self-aligned manner.

3. The method of claim 2 wherein said step of forming said metal gate structure further includes forming an underlying layer of silicide at an interface between said first conductive layer and said layer of deposited silicon.

4. The method of claim 3 wherein said first conductive layer consists essentially of a single metal whose work function has a value at about the middle bandgap of silicon.

5. The method of claim 4 wherein said single metal is tungsten.

6. The method of claim 5 wherein said underlying layer of silicide consists essentially of tungsten silicide.

7. The method of claim 6 wherein said overlying silicide layer consists essentially of cobalt silicide.

8. The method of claim 6 wherein said overlying layer of silicide consists essentially of nickel silicide.

9. The method of claim 1 wherein said gate dielectric includes a material selected from the group consisting of silicon dioxide, silicon nitride, silicon oxynitride, hafnium oxide, and zirconium oxide.

10. The method of claim 1 wherein said opening in said dielectric region is lined with dielectric spacers, said dielectric spacers having been formed on sidewalls of said sacrificial gate.

11. The method of claim 10 wherein said dielectric spacers include L-shaped oxide spacers having sidewalls exposed at said opening and overlying nitride spacers.

12. A method of fabricating a field effect transistor (FET), comprising:
    forming a source region and a drain region in a semiconductor substrate and a sacrificial gate disposed between a pair of spacers overlying said semiconductor substrate, said
    source region and said drain region being disposed on opposite sides of said sacrificial gate;
    forming a dielectric layer on said substrate having a top surface generally planar to a top of said sacrificial gate;
    removing said sacrificial gate to form an opening between said pair of spacers, said opening extending to said semiconductor region;
    forming a gate dielectric on said semiconductor region in said opening;
    forming a first conductive layer in said opening including at least one material selected from the group consisting of metals and compounds of metals;
    depositing a layer of silicon on said first conductive layer in said opening;
    removing said dielectric layer and forming a second metal layer including a silicide-forming metal over said source region and said drain region and said layer of silicon; and
    annealing said substrate to form a silicide from said silicide-forming metal, said silicide contacting said source region and said drain region and contacting said layer of silicon.

13. The method of claim 12 wherein said annealing also forms a silicide at an interface between said first conductive layer and said layer of silicon.

14. The method of claim 13 wherein said silicide-forming metal includes at least one metal selected from the group consisting of cobalt, nickel, titanium and platinum.

15. The method of claim 13, wherein said first layer is separated from said semiconductor substrate only by a thickness of said gate dielectric.

* * * * *